US008405129B2

(12) United States Patent
Chuang et al.

(10) Patent No.: US 8,405,129 B2
(45) Date of Patent: Mar. 26, 2013

(54) STRUCTURE FOR HIGH DENSITY STABLE STATIC RANDOM ACCESS MEMORY

(75) Inventors: Ching-Te K. Chuang, New York, NY (US); Fadi H. Gebara, Austin, TX (US); Keunwoo Kim, Somers, NY (US); Jente Benedict Kuang, Austin, TX (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/450,004

(22) Filed: Apr. 18, 2012

(65) Prior Publication Data

US 2012/0205721 A1    Aug. 16, 2012

Related U.S. Application Data

(63) Continuation of application No. 11/865,780, filed on Oct. 2, 2007, now Pat. No. 8,217,427.

(51) Int. Cl.
*H01L 27/105* (2006.01)

(52) U.S. Cl. .............. 257/206; 257/E27.098; 257/225; 257/234; 257/390; 257/68; 257/71; 257/296; 257/309; 257/905

(58) Field of Classification Search .................. 257/206, 257/225, 234, 390, 68, E27.098, 71, 296, 257/309, 905
See application file for complete search history.

(56) References Cited

U.S. PATENT DOCUMENTS

| | | | |
|---|---|---|---|
| 5,294,821 A | 3/1994 | Iwamatsu | |
| 6,531,741 B1 | 3/2003 | Hargrove et al. | |
| 6,815,296 B2 | 11/2004 | Dennard et al. | |
| 7,115,965 B2 | 10/2006 | Ho et al. | |
| 7,141,459 B2 | 11/2006 | Yang et al. | |
| 7,225,884 B2 | 6/2007 | Aeberhard | |
| 2004/0252548 A1* | 12/2004 | Tsukamoto et al. | 365/154 |
| 2005/0242398 A1 | 11/2005 | Chen et al. | 257/348 |
| 2006/0145264 A1* | 7/2006 | Chidambarrao et al. | 257/369 |
| 2007/0076467 A1 | 4/2007 | Yamaoka et al. | |
| 2007/0290223 A1 | 12/2007 | Yagishita | 257/103 |
| 2008/0237695 A1 | 10/2008 | Shino et al. | 257/324 |

OTHER PUBLICATIONS

Yamaoka et al , "SRAM Circuit with Expended Operating Margin and Reduced Stand-by Leakage Current Using Thin-Box FD-SOI Transistor Proc Tech Papers", Nov. 2005; ieeexplore ieee org/xpls/abs_all jsp?arnumber=4017543.

Ngo et al , "An asymmetrical double-gate VCO with wide frequency range," Apr. 2006; ieeexplore ieee org/xpls/abs_all jsp?isnumber=4016579&arnumber=4016642&count=61&index=60.

(Continued)

*Primary Examiner* — Marc Armand
(74) *Attorney, Agent, or Firm* — Ryan, Mason & Lewis, LLP

(57) ABSTRACT

A design structure tangibly embodied in a machine readable medium for designing, manufacturing, or testing an integrated circuit includes a plurality of bit line structures, a plurality of word line structures intersecting said plurality of bit line structures to form a plurality of cell locations, and a plurality of cells located at said plurality of cell locations, each of said cells being selectively coupled to a corresponding bit line structure under control of a corresponding word line structure, each of said cells comprising a logical storage element having at least a first n-type field effect transistor and at least a first p-type field effect transistor, wherein said at least first n-type field effect transistor is formed with a relatively thick buried oxide layer sized to reduce capacitance of said bit line structures, and said at least first p-type field effect transistor is formed with a relatively thin buried oxide layer.

20 Claims, 6 Drawing Sheets

OTHER PUBLICATIONS

Yamaoka et al., "SRAM Circuit with Expended Operating Margin and Reduced Stand-by Leakage Current Using Thin-Box FD-SOI Transistor, Proc. Tech. Papers", Nov. 2005; ieeexplore.ieee.org/xpls/abs_all.jsp?arnumber=4017543.

Ngo et al., "An asymmetrical double-gate VCO with wide frequency range," Apr. 2006; ieeexplore.ieee.org/xpls/abs_all.jsp?isnumber=4016579&arnumber=4016642&count=61&index=60.

* cited by examiner

STRUCTURE FOR HIGH DENSITY STABLE STATIC RANDOM ACCESS MEMORY

CROSS-REFERENCE TO RELATED APPLICATIONS

This application is a continuation of U.S. patent application Ser. No. 11/865,780 filed Oct. 2, 2007, the complete disclosure of which is expressly incorporated by reference herein in its entirety for all purposes.

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA). The government has certain rights in this invention.

FIELD OF THE INVENTION

The present invention generally relates to electronic circuitry and, more particularly, to a design structure for electronic memory circuits.

BACKGROUND

Due to the increased portion of static random access (SRAM) arrays in the total chip area, device dimensions in SRAM must be continuously scaled. With shorter device channels and widths, the intrinsic device fluctuations and random mismatch among adjacent devices are significantly increased due to random doping fluctuations, short-channel effects, and narrow-width effects. Thus, the stability of SRAM degrades with technology scaling. Random doping fluctuation (RDF) is a major source of variation for SRAM circuits. Using an un-doped body with back-gate biasing in Fully Depleted Silicon-On-Insulator (FD/SOI) or double-gate (DG) devices, as set forth in H. Ngo et al., VLSI-TSA, pp. 147-148, Taiwan, April 2006, can reduce RDF. However, FD/SOI needs a thin buried oxide layer (BOX) for back-gate biasing, which increases the bit-line capacitance and degrades the performance. Local biasing methods for independent-gate controlled double gate (DG) SRAM cells increase the cell area.

In summary, with regard to prior-art approaches, the conventional scaled symmetrical six-transistor (6T) cell is not stable, employing FD/SOI SRAM cells with back-gate biasing degrades Read performance, and using independent-gate controlled DG SRAM cells increases the area.

SUMMARY

Principles of the present invention provide a design structure for high-density stable SRAM with, for example, selective back-gate bias and/or dual buried oxide.

In an example embodiment, according to one aspect of the invention, a design structure tangibly embodied in a machine readable medium for designing, manufacturing, or testing an integrated circuit includes a plurality of bit line structures, a plurality of word line structures intersecting said plurality of bit line structures to form a plurality of cell locations, and a plurality of cells located at said plurality of cell locations, each of said cells being selectively coupled to a corresponding one of said bit line structures under control of a corresponding one of said word line structures, each of said cells in turn comprising a logical storage element having at least a first n-type field effect transistor and at least a first p-type field effect transistor, wherein said at least first n-type field effect transistor is formed with a relatively thick buried oxide layer sized to reduce capacitance of said bit line structures, and said at least first p-type field effect transistor is formed with a relatively thin buried oxide layer.

In another example embodiment, according to another aspect of the invention, a design structure tangibly embodied in a machine readable medium for designing, manufacturing, or testing an integrated circuit includes a voltage supply, a plurality of n-type field effect transistors having back gates, at least some of said plurality of n-type field effect transistors being formed with a relatively thick buried oxide layer, and a plurality of p-type field effect transistors having back gates and being formed with a relatively thin buried oxide layer, wherein said back gates of said n-type field effect transistors and said back gates of said p-type field effect transistors are electrically interconnected to said voltage supply, said voltage supply being configured to supply a back gate bias thereto, and at least some of said plurality of n-type field effect transistors which are timing-critical are formed with a relatively thin buried oxide layer.

In yet another example embodiment, according to another aspect of the invention, a design structure tangibly embodied in a machine readable medium for designing, manufacturing, or testing an integrated circuit includes a voltage supply, a plurality of n-type field effect transistors having back gates, at least some of said plurality of n-type field effect transistors being formed with a relatively thick buried oxide layer, and a plurality of p-type field effect transistors having back gates and being formed with a relatively thin buried oxide layer, wherein said back gates of said n-type field effect transistors are electrically interconnected to said voltage supply, said voltage supply being configured to supply a back gate bias thereto, and at least some of said plurality of n-type field effect transistors which are timing-critical are formed with a relatively thin buried oxide layer.

Further, in another example embodiment, according to another aspect of the invention, a design structure tangibly embodied in a machine readable medium for designing, manufacturing, or testing an integrated circuit includes a voltage supply, a plurality of n-type field effect transistors having back gates, at least some of said plurality of n-type field effect transistors being formed with a relatively thick buried oxide layer, and a plurality of p-type field effect transistors having back gates and being formed with a relatively thin buried oxide layer, wherein said back gates of said p-type field effect transistors are electrically interconnected to said voltage supply, said voltage supply being configured to supply a back gate bias thereto, and at least some of said plurality of n-type field effect transistors which are timing-critical are formed with a relatively thin buried oxide layer.

These and other objects, features and advantages of the present invention will become apparent from the following detailed description of illustrative embodiments thereof, which is to be read in connection with the accompanying drawings.

DETAILED DESCRIPTION

One or more embodiments of the invention enable improvement in the stability of SRAM cells, by using dual BOX in FD/SOI technology. A relatively thick BOX is used for n-type field effect transistors (nFETs), thus reducing the bit-line capacitance. A relatively thin BOX is used for p-type field effect transistors (pFETs), thus allowing adaptive back-gate biasing to optimize Read and Write performance. In one or more embodiments, inventive structures minimize the area overhead, compared with other back-gate biasing schemes, to facilitate a very dense cell layout. At least some embodiments afford the advantage of Read and Write Noise Margin improvements without increasing area. One or more inventive embodiments can be used to improve stability in future SOI SRAM without significantly degrading leakage power and/or dynamic power and/or without significantly increasing area.

Figure 1:
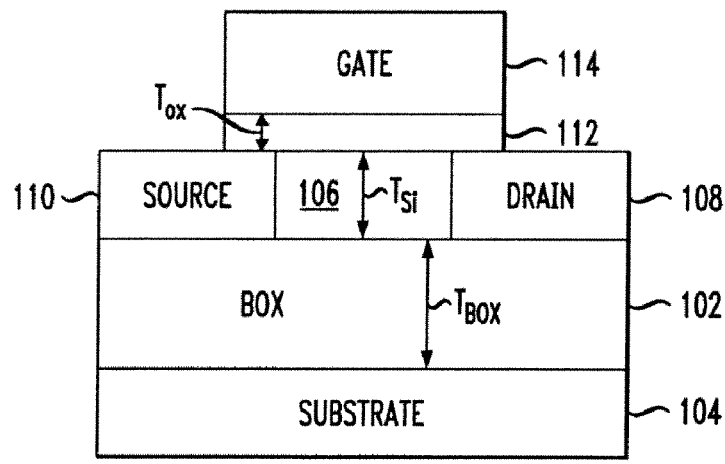
FIG. 1 shows a silicon-on-insulator (SOI) device structure, according to the prior art.

Before describing in detail an exemplary embodiment of the invention, it is instructive to first view FIG. 1, which shows the conventional SOI device structure. In particular, a layer of buried oxide (BOX) 102 is formed outward of substrate 104. The BOX has a thickness $T_{BOX}$. Formed outwardly of BOX 102 are drain 108 and source 110 separated by silicon (body) region 106 having thickness $T_{Si}$. Gate 114 is separated from elements 106, 108, 110 by oxide layer 112 having thickness $T_{OX}$.

Figure 2:
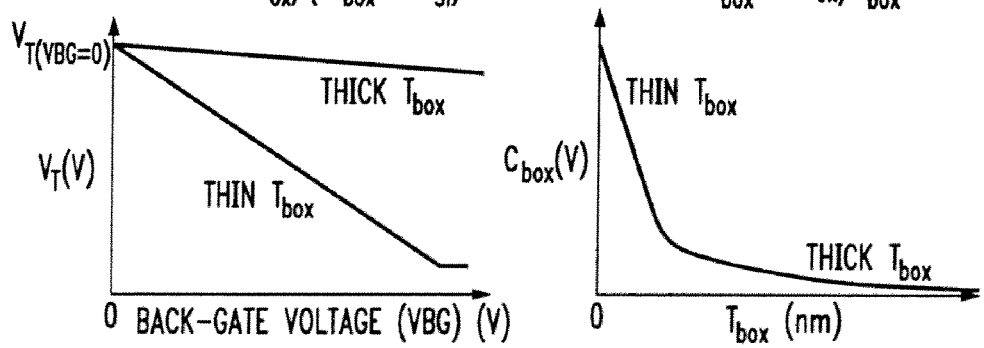
FIG. 2 shows the dependency of threshold voltage on back gate voltage and buried oxide capacitance on buried oxide (BOX) thickness, for n-type field effect transistors (nFETs)

FIG. 2 shows threshold voltage $V_T$ versus back-gate voltage VBG for relatively thick and thin $T_{box}$, as well as capacitance of the BOX ($C_{box}$) versus thickness of the BOX layer ($T_{box}$) characteristics. Thin BOX for the access nFET devices increases the bit-line capacitance due to increased capacitance of the BOX, $C_{box}$. Thin BOX for the pull-up pFET devices, however, can allow back-gate modulation for un-doped thin-film FD/SOI technology.

The threshold voltage is given by:

$$V_T = V_{T(VBG=0)} - (r)(VBG) \tag{1}$$

where $V_T$ is threshold voltage, $V_{T(VBG=0)}$ is threshold voltage with no applied back gate ("BG") voltage, r is a parameter given below, and VBG is the back gate voltage.

The parameter r can be approximated as shown below:

$$r \approx 3T_{OX}/(3T_{BOX}+T_{Si}) \tag{2}$$

The bit line capacitance, CBIT is given by:

$$C_{BIT} = C_{wire} + C_{box} + C_{ov} + C_j \tag{3}$$

where $C_{wire}$ is wire capacitance, $C_{box}$ is given below, $C_{ov}$ is overlap capacitance, and $C_j$ is junction capacitance. Note that the upper case subscript "BOX" and the lower case subscript "box" are used interchangeably herein for convenience.

$$C_{box} = \epsilon_{ox}/t_{box} \tag{4}$$

Figure 3:
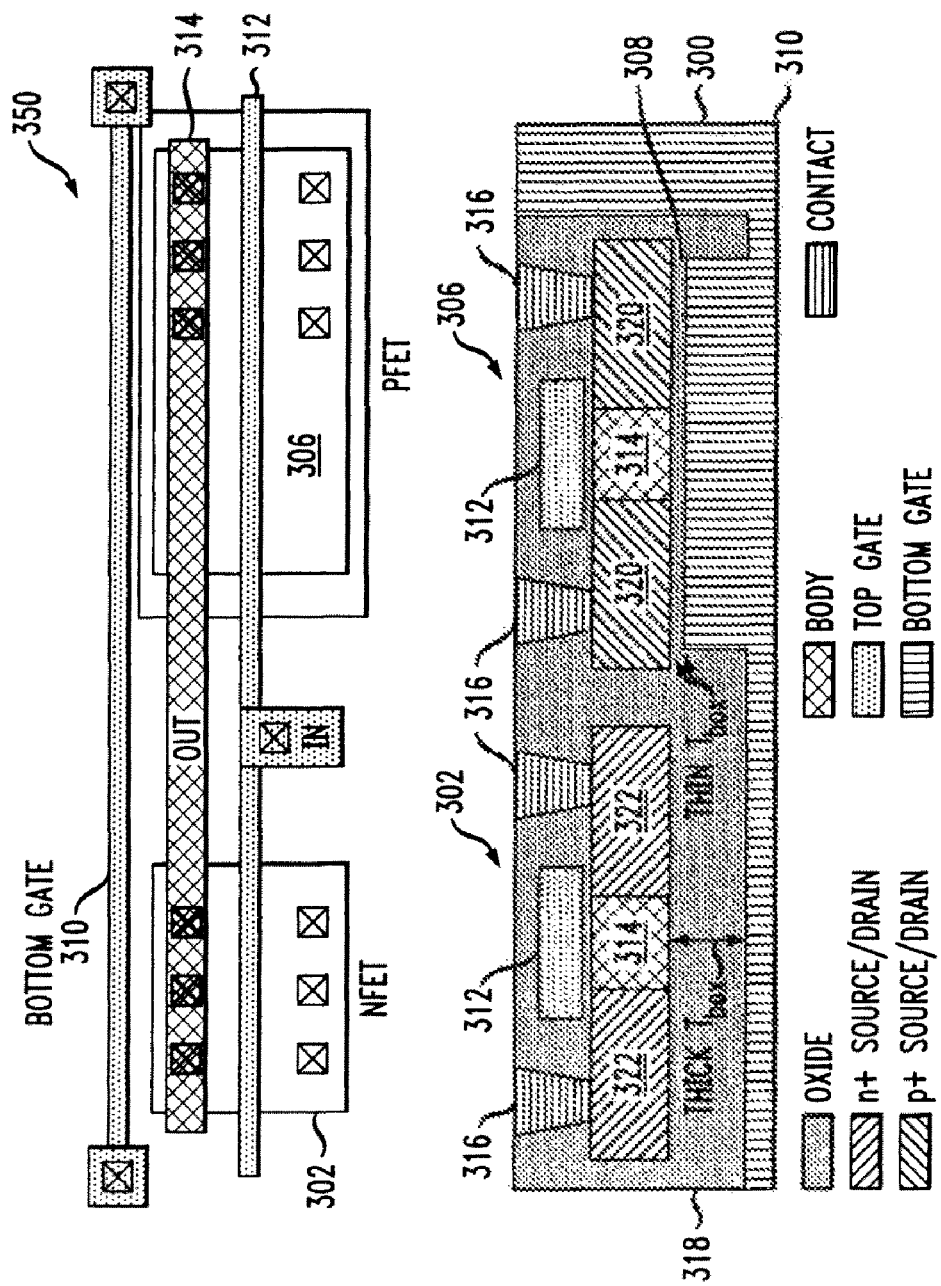
FIG. 3 shows an exemplary inventive dual BOX device structure, according to an aspect of the invention.

FIG. 3 shows an exemplary inventive SOI device structure 300 with dual BOX. Also shown is the layout of an inverter 350 as an example of dense layout. The nFET 302 has thick BOX 304 with essentially no back-gate bias effect (as shown in FIG. 2). The pFET 306 has thin BOX 308, and adaptive back-gate bias can be applied to improve the stability and Read/Write performance. The use of an un-doped body for the pFET reduces the RDF effects and facilitates effective back-gate biasing. For the nFET, a doped body is preferred, as it reduces the sensitivity to back-gate bias. The use of a common back-gate for the nFET and pFET results in a very dense layout. During the Read operation, the back-gate is biased to a logical "Low," thus strengthening the pull-up pFET and skewing the trip voltage of the cell inverter to improve the Read noise margin. During the Write operation, the back-gate is biased to a logical "High," thus weakening the pull-up pFET to improve the Write performance and margin. One or more implementations of the inventive aspects depicted in FIG. 3 may afford advantages such as little or no area/performance penalty in FD/SOI Technology, improved Read stability and Writeability, as well as stability in Half-Select Cases. Also depicted in FIG. 3 are bottom gate 310 (also referred to as a back gate or a buried oxide gate), top gate 312, body 314, and contacts 316. Region 318 is oxide. The pFET source-drain regions are 320 and the nFET source-drain regions are 322. In one or more embodiments, the SOI substrate can be shared across all the cells, with its bias impacting only the thin-BOX pFETs.

Figure 4:
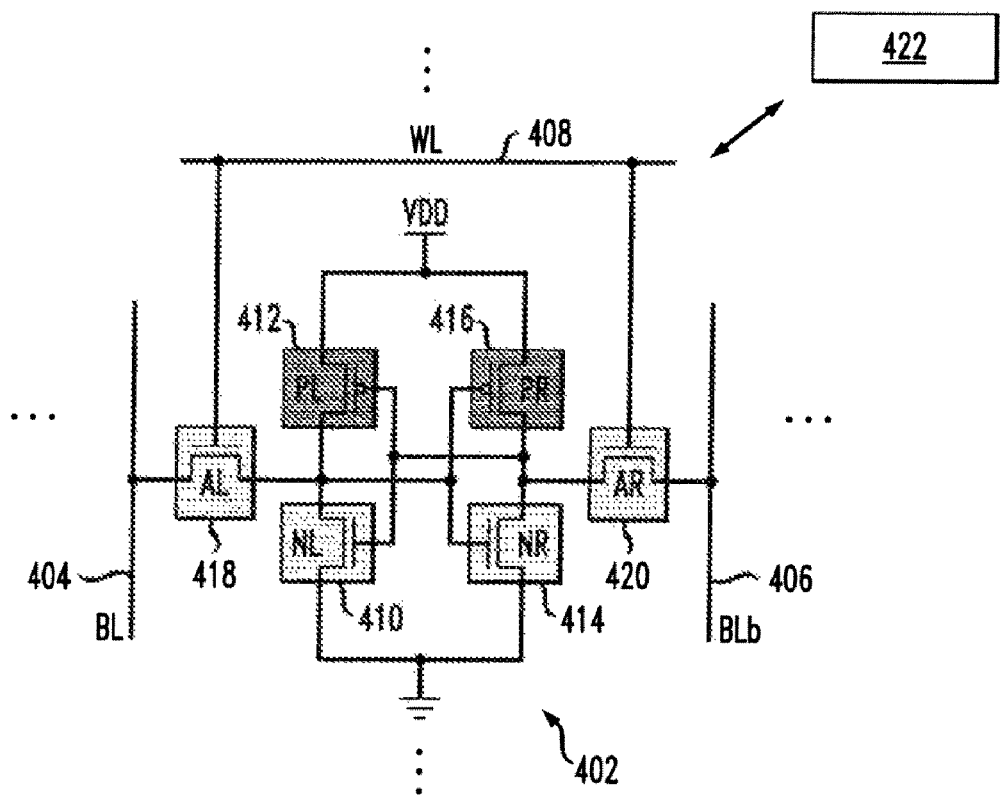
FIG. 4 shows an exemplary inventive SRAM cell within an exemplary inventive circuit, according to another aspect of the invention.

Attention should now be given to FIG. 4, which shows an inventive cell 402 that may be one of many cells in a memory circuit, as indicated by the ellipses. The circuit can include a plurality of bit line structures, such as those formed by true bit line 404 and complementary bit line 406. A plurality of word line structures, such as may be formed by individual word lines 408, intersect the plurality of bit line structures to form a plurality of cell locations. A plurality of cells 402 are located at the plurality of cell locations, and each of the cells is selectively coupled to a corresponding one of the bit line structures under control of a corresponding one of the word line structures (for example, by access devices as discussed below).

Each of the cells 402 in turn includes a logical storage element having at least a first n-type field effect transistor and at least a first p-type field effect transistor. The at least first n-type field effect transistor is formed with a relatively thick buried oxide layer sized to reduce capacitance of the bit line structures, and the at least first p-type field effect transistor is formed with a relatively thin buried oxide layer. In the exemplary embodiment, the logical storage element is a storage flip-flop, in turn including a first inverter formed from nFET NL and pFET PL, numbered 410 and 412, respectively, and a second inverter formed from nFET NR and pFET PR, numbered 414 and 416, respectively, the second inverter being cross-coupled to the first inverter to form the storage flip-flop. Also included are access devices AL and AR, numbered 418, 420 respectively. The p-type devices 412, 416 are formed with un-doped bodies and relatively thin BOX, while the n-type devices 410, 414, 418, 420 are formed with doped or un-doped bodies and relatively thick BOX. As used herein, "thick" BOX refers to a thickness such that back gate control is substantially not effective. In one or more embodiments, such a "thick" BOX will be comparable in thickness to that of a conventional FD SOL structure, for example, greater than about 30 nm for 65 nm SOI technology node. Further, as used herein, "thin" BOX refers to a thickness such that an applied back gate voltage can substantially effectively modulate the threshold voltage. In one or more embodiments, such a "thin" BOX will be no more than about one-third as thick as the "thick" BOX; thin BOX is typically less than about 10 nm, for example, about 1-10 nm.

The n-and/or p-type devices can, in one or more embodiments, have top gates and bottom gates (also referred to herein as front and back gates—in SOI technology, these are not necessarily similar in size, as in double-gate devices). In some instances, the relatively thin buried oxide layers of the p-type field effect transistors are sized to permit adaptive back-gate bias of the p-type field effect transistors to enhance read and write performance of the circuit. Further, in some instances, the back gates of the n-type field effect transistors and p-type field effect transistors are formed as a common back gate.

The circuit can also include voltage supply circuitry 422 configured to apply a relatively low back-gate bias during read operations and/or to apply a relatively high back-gate bias during write operations. In operation of one or more embodiments, the back-gate bias may be substantially zero during a READ and may be substantially VDD during standby and WRITE. This tends to increase the threshold voltage in the pFETs to reduce leakage during standby, to reduce the threshold voltage in the pFETs during READ, to improve READ stability without degrading READ performance, and to increase the threshold voltage in the pFETs during WRITE, for improved writeablity and WRITE performance.

Figure 5:
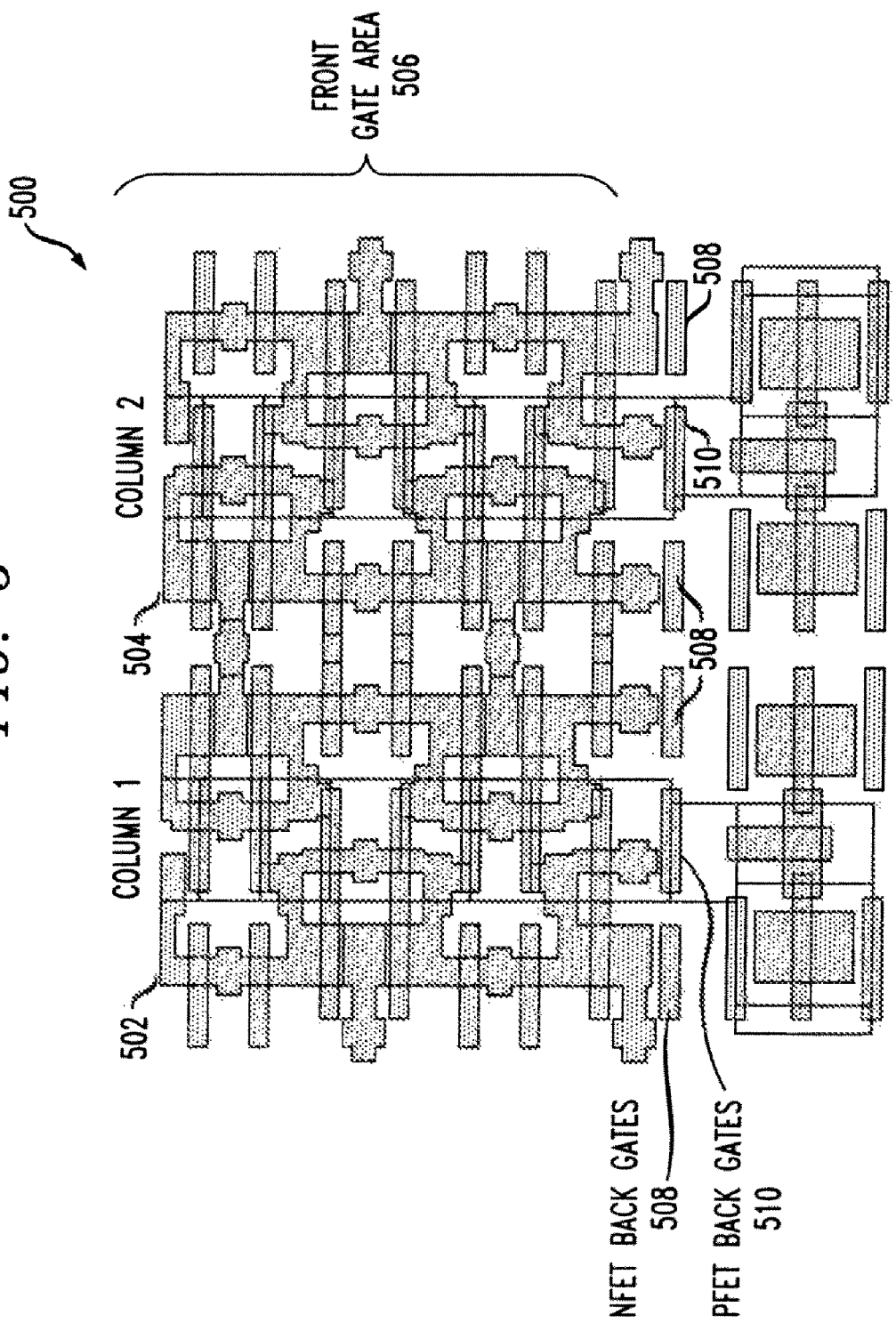
FIG. 5 shows an exemplary layout (depicting the edge of two columns) of an inventive dual BOX SOI SRAM, according to yet another aspect of the invention.
Figure 6:
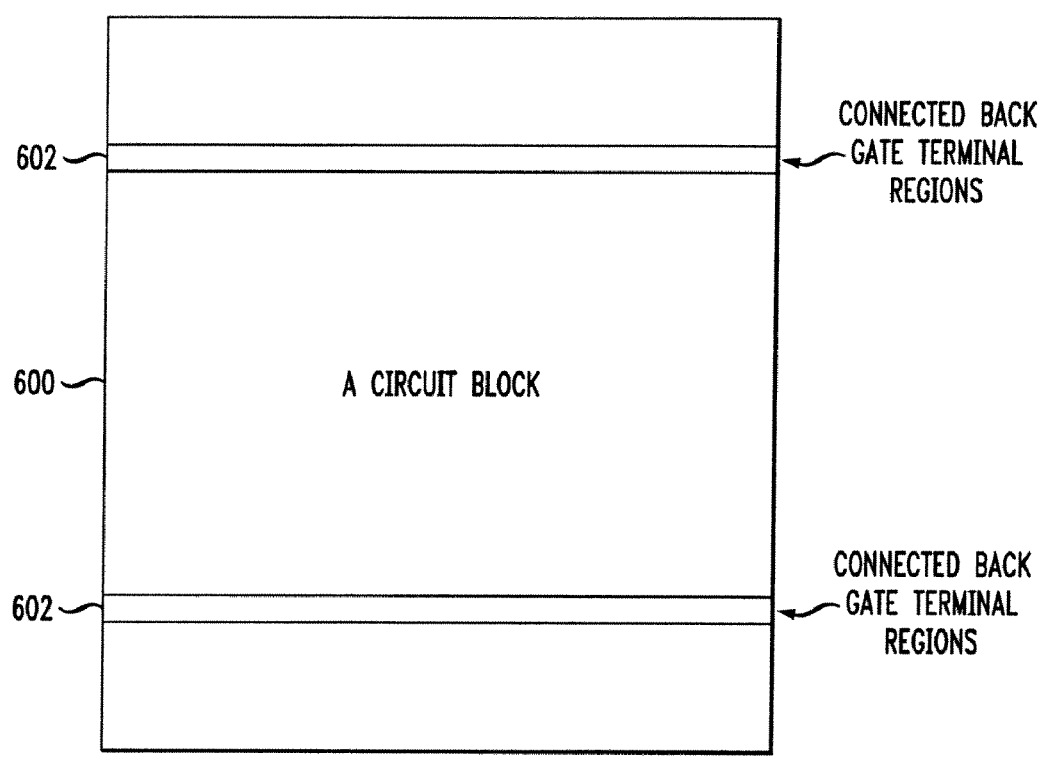
FIG. 6 shows an exemplary layout with back-gate control strips.

FIG. 5 shows an exemplary layout 500 (depicting the edge of two columns, 502 and 504 of an inventive dual BOX SOI SRAM, according to yet another aspect of the invention. The front gate area is designated as 506. Also depicted are nFET back gates 508 and pFET back gates 510. FIG. 6 shows an embodiment with back-gate control strips, to be discussed further below.

Figure 8:
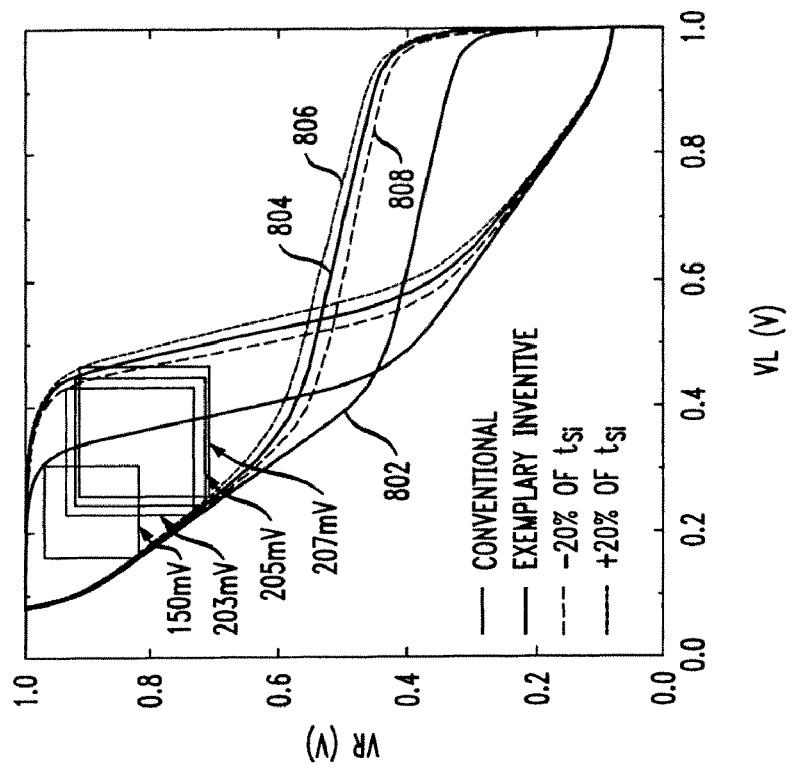
FIG. 8 shows a comparison of signal-to-noise margin (SNM) for a conventional cell and one specific exemplary embodiment of an inventive cell, including effects of process variation in the silicon thickness.
Figure 7:
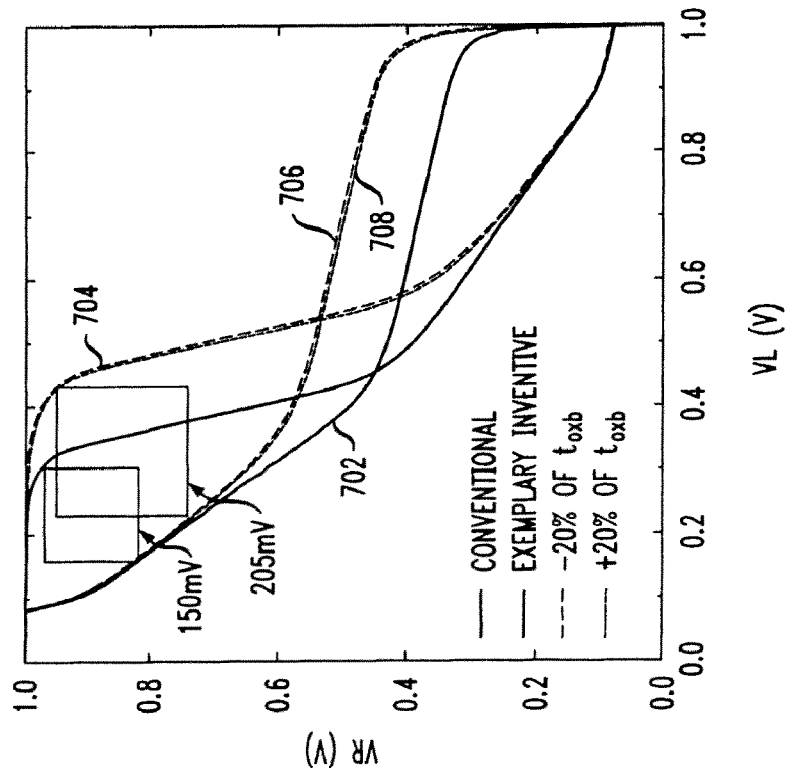
FIG. 7 shows a comparison of signal-to-noise margin (SNM) for a conventional cell and one specific exemplary embodiment of an inventive cell, including effects of process variation in the thickness of the BOX.

FIG. 7 shows predicted Read Static Noise Margin (SNM) for the conventional (702) and exemplary inventive schemes under nominal conditions (704) and conditions of process variation (+/−20% variation in the thickness of the BOX) (706, 708, respectively). Curves 704, 706, 708 are substantially coincident. FIG. 8 shows predicted Read Static Noise Margin (SNM) for the conventional (802) and exemplary inventive schemes under nominal conditions (804) and conditions of process variation (+/−20% variation in the silicon thickness) (806, 808, respectively). Conventional FD/SOI devices have a gate length of 25 nm, front-gate oxide thickness of 1 nm, BOX thickness of 100 nm, and doped ($5\times10^{18}$ cm$^{-3}$) Si film thickness of 10 nm. In the exemplary inventive scheme, all nFETs including pull-down devices and access devices are the same as the conventional thick BOX FD/SOI. However, pull-up pFET devices have thin BOX ($T_{box}$=10 nm) and un-doped bodies, and other device parameters are the same ($T_{ox}$=1 nm and $T_{Si}$=10 nm) as in the conventional case. The SNM for the inventive scheme is significantly improved (by ~37%) compared with the conventional 6T FD/SOI cell (205 mV vs. 150 mV). It should be emphasized that FIG. 7 is exemplary in nature and there is no intention to limit the invention to the specific dimensions or percentages of improvement set forth therein. FIG. 7 demonstrates that one or more embodiments of the invention are relatively insensitive (in terms of READ SNM) to process variations.

The invention is not limited to SOI technology, and, given the teachings herein, the skilled artisan will be readily enabled to adapt inventive techniques to approaches employing independent gate-controlled fin-type field effect transistors (FinFETs) or SOI technology with back-gating capability.

In an alternative embodiment, a global "constant" substrate biasing can be applied, with only one contact for each column of the SRAM, to reduce the area penalty. In such a case, $V_T$ for the nFETs can be controlled by channel dopants to reduce short-channel effects (SCE), and $V_T$ for pFETs can be controlled by back-gate biasing to reduce SCE (and RDF). The actual layout is similar to FIG. 5, except with all back-gates connected as one SOI substrate. In one or more embodiments, back gate bias can be controlled by adapting known techniques to the present invention, as will be apparent to the skilled artisan given the teachings herein. A voltage regulator with a comparator circuit can be employed. The input to the regulator could be, for example, from a divider, a bandgap voltage reference, or a constant-gm bias circuit. The regulator output can be selected as the appropriate level (such as ground or VDD) for each mode by a voltage multiplexer.

Referring again to FIG. 6, in this alternative embodiment of a circuit block 600, back gate control strips 602 can be employed to connect the back-gate terminal regions. This embodiment allows keeping circuit blocks in a low-leakage state when they are in power-down modes, with fine-tuning of circuit block timing when in an active mode. The back gate region can be implemented with nFETs, pFETs, or mixed nFETs and pFETs, depending on area and circuit property considerations. The area overhead is relatively small, and in one or more embodiments, timing is not especially important as the intention is for dc control and the voltage range is typically small. Thus, in this aspect, a complementary metal oxide semiconductor circuit includes a voltage supply (as shown and discussed elsewhere), and a plurality of n-type field effect transistors having back gates. At least some of the plurality of n-type field effect transistors are formed with a relatively thick buried oxide layer. The circuit also includes a plurality of p-type field effect transistors having back gates and formed with a relatively thin buried oxide layer. The back gates of the n-type field effect transistors and/or the back gates of the p-type field effect transistors are electrically interconnected to the voltage supply, which is configured to supply a back gate bias thereto. At least some of the plurality of n-type field effect transistors which are timing-critical (that is, they are within a path that determines the speed at which the circuit can operate) are formed with a relatively thin buried oxide layer.

Memory cells according to one more aspects of the present invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die is typically fabricated in a repeated pattern on a surface of a semiconductor wafer. Each die can include one or more of the cells described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed. In one or more embodiments, fabrication techniques as set forth in U.S. Pat. No. 6,531,741 to Hargrove et al., entitled "Dual buried oxide film SOI structure and method of manufacturing the same" can be employed. The complete disclosure of the aforesaid U.S. Pat. No. 6,531,741 to Hargrove et al. is expressly incorporated herein by reference for all purposes.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A design structure tangibly embodied in a machine readable medium for designing, manufacturing, or testing an integrated circuit, the design structure comprising:
   a plurality of bit line structures;
   a plurality of word line structures intersecting said plurality of bit line structures to form a plurality of cell locations; and
   a plurality of cells located at said plurality of cell locations, each of said cells being selectively coupled to a corresponding one of said bit line structures under control of a corresponding one of said word line structures, each of said cells in turn comprising a logical storage element having at least a first pull-down device, at least a first access device, and at least a first pull-up device;
   wherein:
   said at least first is pull-down device and said at least first access device are formed with a relatively thick buried oxide layer sized to reduce capacitance of said bit line structures; and
   said at least first pull-up device is formed with a relatively thin buried oxide layer.

2. The design structure of claim 1, wherein said logical storage element comprises a storage flip-flop, said storage flip-flop in turn comprising:
   a first inverter formed from said at least one pull-down device and said at least one pull-up device; and
   a second inverter having a second pull-down device formed with a relatively thick buried oxide layer sized to reduce capacitance of said bit line structures and a second pull-up device formed with a relatively thin buried oxide layer, said second inverter being cross-coupled to said first inverter to form said storage flip-flop.

3. The design structure of claim 1, wherein said circuit is formed in silicon-on-insulator technology.

4. The design structure of claim 1, wherein at least said at least first pull-down device, said at least first access device and said at least first pull-up device are fin-type field effect transistors.

5. The design structure of claim 1 wherein said relatively thin buried oxide layer is no more than about one-third as thick as said relatively thick buried oxide layer.

6. The design structure of claim 1 wherein said relatively thick buried oxide layer is comparable in thickness to that of a conventional fully-depleted silicon-on-insulator circuit structure.

7. The design structure of claim 1, wherein said relatively thick buried oxide layer is sufficiently thick such that back-gate control of said at least first pull-down device and said at least first access device is substantially ineffective.

8. The design structure of claim 1, wherein said relatively thin buried oxide layer is sufficiently thin such that back-gate control of said at least first pull-up device is substantially effective.

9. The design structure of claim 1 wherein said relatively thin buried oxide layer is less than about ten nanometers in thickness.

10. The design structure of claim 1 wherein said relatively thick buried oxide layer is greater than about thirty nanometers in thickness.

11. The design structure of claim 2, wherein:
    said pull-up devices are formed with front gates and back gates; and
    said relatively thin buried oxide layers of said pull-up devices are sized to permit adaptive back-gate bias of said pull-up devices to enhance read and write performance of said circuit.

12. The design structure of claim 11, wherein said pull-up devices are formed with substantially un-doped bodies.

13. The design structure of claim 11, wherein said pull-down and access devices are formed with doped bodies.

14. The design structure of claim 11, wherein said pull-down and access devices are formed with substantially un-doped bodies.

15. The design structure of claim 11, wherein:
    said pull-down and access devices are formed with front gates and back gates; and
    said back gates of said pull-down device and pull-up devices are formed as a common back gate.

16. The design structure of claim 15, further comprising voltage supply circuitry configured to apply a relatively low back-gate bias during read operations.

17. The design structure of claim 16, wherein said voltage supply circuitry is further configured to apply a relatively high back-gate bias during write operations.

18. A design structure tangibly embodied in a machine readable medium for designing, manufacturing, or testing an integrated circuit, the design structure comprising:
- a voltage supply;
- a plurality of pull-down and access devices having back gates, at least some of said plurality of pull-down and access devices being formed with a relatively thick buried oxide layer; and
- a plurality of pull-up devices having back gates and being formed with a relatively thin buried oxide layer;

wherein:
- said back gates of said pull-down and access devices and said back gates of said pull-up devices are electrically interconnected to said voltage supply, said voltage supply being configured to supply a back gate bias thereto; and
- at least some of said plurality of pull-down and access devices which are timing-critical are formed with a relatively thin buried oxide layer.

19. A design structure tangibly embodied in a machine readable medium for designing, manufacturing, or testing an integrated circuit, the design structure comprising:
- a voltage supply;
- a plurality of pull-down and access devices having back gates, at least some of said plurality of pull-down and access devices being formed with a relatively thick buried oxide layer; and
- a plurality of pull-up devices having back gates and being formed with a relatively thin buried oxide layer;

wherein:
- said back gates of said pull-down and access devices are electrically interconnected to said voltage supply, said voltage supply being configured to supply a back gate bias thereto; and
- at least some of said plurality of pull-down and access devices which are timing-critical are formed with a relatively thin buried oxide layer.

20. A design structure tangibly embodied in a machine readable medium for designing, manufacturing, or testing an integrated circuit, the design structure comprising:
- a voltage supply;
- a plurality of pull-down and access devices having back gates, at least some of said plurality of pull-down and access devices being formed with a relatively thick buried oxide layer; and
- a plurality of pull-up devices having back gates and being formed with a relatively thin buried oxide layer;

wherein:
- said back gates of said pull-up devices are electrically interconnected to said voltage supply, said voltage supply being configured to supply a back gate bias thereto; and
- at least some of said plurality of pull-down and access devices which are timing-critical are formed with a relatively thin buried oxide layer.

* * * * *